United States Patent
Opsahl

(10) Patent No.: US 6,581,082 B1
(45) Date of Patent: Jun. 17, 2003

(54) REDUCED GATE COUNT DIFFERENTIATOR

(75) Inventor: Paul L. Opsahl, Cedar Rapids, IA (US)

(73) Assignee: Rockwell Collins, Cedar Rapids, IA (US)

( * ) Notice: Subject to any disclaimer, the term of this patent is extended or adjusted under 35 U.S.C. 154(b) by 0 days.

(21) Appl. No.: 09/510,763

(22) Filed: Feb. 22, 2000

(51) Int. Cl.[7] .............................................. G06F 7/38
(52) U.S. Cl. ..................................................... 708/443
(58) Field of Search ............................... 708/443, 444, 708/276, 270, 271, 273, 274; 327/159; 331/1 A

(56) References Cited

U.S. PATENT DOCUMENTS

| | | | |
|---|---|---|---|
| 4,609,881 A | | 9/1986 | Wells ........................... 331/1 A |
| 4,996,699 A | * | 2/1991 | Rudolph ....................... 708/103 |
| 5,038,117 A | | 8/1991 | Miller ............................ 331/16 |
| 5,093,632 A | * | 3/1992 | Hietala et al. ............... 331/1 A |
| 5,166,642 A | * | 11/1992 | Hietala ......................... 331/1 A |
| 5,781,459 A | * | 7/1998 | Bienz ........................... 708/271 |
| 5,808,493 A | * | 9/1998 | Akiyama et al. ............ 327/159 |
| 5,898,325 A | * | 4/1999 | Crook et al. ................. 708/276 |
| 5,903,194 A | | 5/1999 | Opsahl et al. ............... 331/1 A |
| 5,905,388 A | * | 5/1999 | Van Der Valk et al. ..... 708/271 |
| 6,008,704 A | * | 12/1999 | Opsahl et al. ............... 332/127 |
| 6,091,269 A | * | 7/2000 | Rossum ....................... 708/271 |
| 6,262,604 B1 | * | 7/2001 | Gabet et al. ................. 708/271 |
| 6,433,643 B1 | * | 8/2002 | Opsahl et al. ............... 331/1 A |

OTHER PUBLICATIONS

Uchino et al., Frequency syntgesizer and guassian noise generator using the same, Aug. 23, 2001, United states patent application publication No. 2002/0016863 A1.*

Khan, Direct digital frequency synthesizer and a hybrid frequency synthesizer combining a direct digital frequency synthesizer and a phase locked loop, Jan. 24, 2002, United states patent application publication No. 2002/0008588 A1.*

Brian Miller, IEEE Transaction On Instrumentation And Measurement (Miller and Conley,) vol. 40, No. 3, Jun. 1991, A Multiple Modulator Fractional Divider, pp. 578–583.

* cited by examiner

*Primary Examiner*—Chuong Dinh Ngo
*Assistant Examiner*—Chat C. Do
(74) *Attorney, Agent, or Firm*—Nathan O. Jensen; Kyle Eppele

(57) ABSTRACT

A polynomial expansion of the z-transform characterization of an n'th order differentiator component's output is utilized to implement a differentiator having reduced gates. The differentiator component comprises at least one adder and a plurality of latches, both having inputs and outputs. The connection of the inputs and outputs is dependent on a polynomial expansion of the z-transform characterization of the differentiator components output. A method of reducing gates in an Nth order differentiator component includes characterizing the differentiator component's output by a z-transform. A polynomial expansion of the z-transform characterization is used to implement a differentiator. A differentiator that is implemented based on a polynomial expansion utilizes fewer gates to achieve the same mathematical function.

14 Claims, 9 Drawing Sheets

$$[(Y_0+Y_1+Y_2+Y_3)+(Y_2+3Y_3)z^{-2}]-[(Y_1+2Y_2+3Y_3)z^{-1}+(Y_3)z^{-3}]-1=\text{OUTPUT}$$

56A — $\boxed{Y_0 + Y_1(1-z^{-1})^1 + Y_2(1-z^{-1})^2 + Y_3(1-z^{-1})^3 = X + E_{q4}(1-z^{-1})^4}$ 58A — $Y_0 + Y_1(1-z^{-1}) + Y_2(1-2z^{-1}+z^{-2}) + Y_3(1-3z^{-1}+3z^{-2}-z^{-3}) = X + E_{q4}(1-z^{-1})^4$ 58B — $Y_0 + Y_1 - Y_1 z^{-1} + Y_2 - 2Y_2 z^{-1} + Y_2 z^{-2} + Y_3 - 3Y_3 z^{-1} + 3Y_3 z^{-2} - Y_3 z^{-3} = X + E_{q4}(1-z^{-1})^4$ 58C — $Y_0 + Y_1 + Y_2 + Y_3 - Y_1 z^{-1} - 2Y_2 z^{-1} - 3Y_3 z^{-1} + Y_2 z^{-2} + 3Y_3 z^{-2} - Y_3 z^{-3} = X + E_{q4}(1-z^{-1})^4$ 58D — $(Y_0 + Y_1 + Y_2 + Y_3) - (Y_1 + 2Y_2 + 3Y_3)z^{-1} + (Y_2 + 3Y_3)z^{-2} - (Y_3)z^{-3} = X + E_{q4}(1-z^{-1})^4$ 58E — $(Y_0 + Y_1 + Y_2 + Y_3) + (Y_2 + 3Y_3)z^{-2} - (Y_1 + 2Y_2 + 3Y_3)z^{-1} - (Y_3)z^{-3} = X + E_{q4}(1-z^{-1})^4$ 58F — $[(Y_0 + Y_1 + Y_2 + Y_3) + (Y_2 + 3Y_3)z^{-2}] - [(Y_1 + 2Y_2 + 3Y_3)z^{-1} + (Y_3)z^{-3}] = X + E_{q4}(1-z^{-1})^4$ $\underbrace{\phantom{XXXXXXXXXXXXXXXXXXX}}_{\text{POSITIVE TERMS}}$ $\underbrace{\phantom{XXXXXXXXXXXXXXXX}}_{\text{NEGATIVE TERMS}}$ $$[(Y_0+Y_1+Y_2+Y_3)+(Y_2+3Y_3)z^{-2}]-[(Y_1+2Y_2+3Y_3)z^{-1}+(Y_3)z^{-3}]-1=\text{OUTPUT}$$

REDUCED GATE COUNT DIFFERENTIATOR

BACKGROUND OF THE INVENTION

A. Field of the Invention

The present invention relates to a discrete-signal differentiator component. More specifically, the present invention relates to a method and apparatus for reducing the number of gates within a discrete-signal differentiator component. A reduction in gates can reduce the power consumption of the differentiator component. The differentiator component can be used in sigma-delta modulation.

B. Problems in the Art

The use of a discrete-signal differentiator component within a multistage noise shaper (MASH) is known in the art. In addition, the use of a MASH structure in fractional-N frequency synthesizers is also known in the art. Fractional-N frequency synthesizers are disclosed in U.S. Pat. Nos. 4,609,881, and 5,038,117, the disclosures of which are hereby incorporated by reference in their entirety.

Fractional-N synthesizers are used to synthesize output signals. The frequency of the output signal is a rational multiple of a reference signal. Frequency divider circuits are implemented such that they only divide by an integer value. Therefore, fractional division is realized by changing the divisor integer value during consecutive division cycles. The non-integer division ratios are realized by dividing by N+1, for example, instead of dividing by N, on a proportional number of division cycles. For example, if the desired rational divisor is taken to be N.1, the divisor value would be N for nine division cycles and N+1 for the tenth division cycle. Thus, when averaged over ten cycles, the division factor equals N.1 and an output frequency of a voltage controlled oscillator (VCO) will be N.1 times the reference frequency.

Logic gates are generally utilized to implement specific functional components, such as adders and latches, within the differentiator component. The logic gates in turn are comprised of transistors. The transistors may be bipolar junction transistors (BJT), field-effect transistors (FET), gallium arsenide transistors (GaAs), or any other type of transistor. All of the transistors need power. The transistors, particularly BJTs used in emitter coupled logic (ECL) families, are relatively inefficient with respect to power usage. Therefore, there is a need in the art for a differentiator component which can be implemented with a reduced number of gates. Reducing the number of gates will reduce the number of transistors needed to implement these gates. Reduction in transistors would lead to a reduction in power requirements for the differentiator component. Also, a reduction in gates would reduce the amount of heat produced by the differentiator component. Additionally, a reduction of gates would reduce the risk of failure of the differentiator component. Such a differentiator component is disclosed by the present invention.

C. Features of the Invention

A primary feature of the present invention is a discrete-signal differentiator component which requires fewer logic gates to implement the same function as prior art differentiator components.

Another feature of the present invention is a discrete-signal differentiator component which requires less power than those found in the prior art.

Another feature of the present invention is a discrete-signal differentiator component which requires fewer transistors that are susceptible to failure.

Another feature of the present invention is a differentiator component which implements a polynomial expansion of a z-transform characterization of the differentiator component's output.

An optional feature of the present invention is a differentiator component that realizes coefficients through implicit multiplication.

A further feature of the present invention is a method of reducing gates in a differentiator component.

These, as well as other features of the present invention, will be apparent from the following detailed description and claims in conjunction with the accompanying drawings.

SUMMARY OF THE INVENTION

An n signal differentiator component, wherein n is greater than or equal to two, comprises latches and adders having inputs and outputs. The connection of the inputs and outputs is dependent on a polynomial expansion of a z-transform characterization of an output of the differentiator component.

A method of reducing gates in an n signal differentiator component comprises constructing a circuit to perform the differentiator function. The circuit is dependent upon a polynomial expansion of the z-transform characterization of the differentiator component's output.

BRIEF DESCRIPTION OF THE DRAWINGS

FIG. 3 shows a series of equations which represent the z-transform characterization of the output of a fourth order MASH structure that utilizes a four signal differentiator component according to the present invention.

DETAILED DESCRIPTION OF AN EXEMPLARY EMBODIMENT

Figure 1:
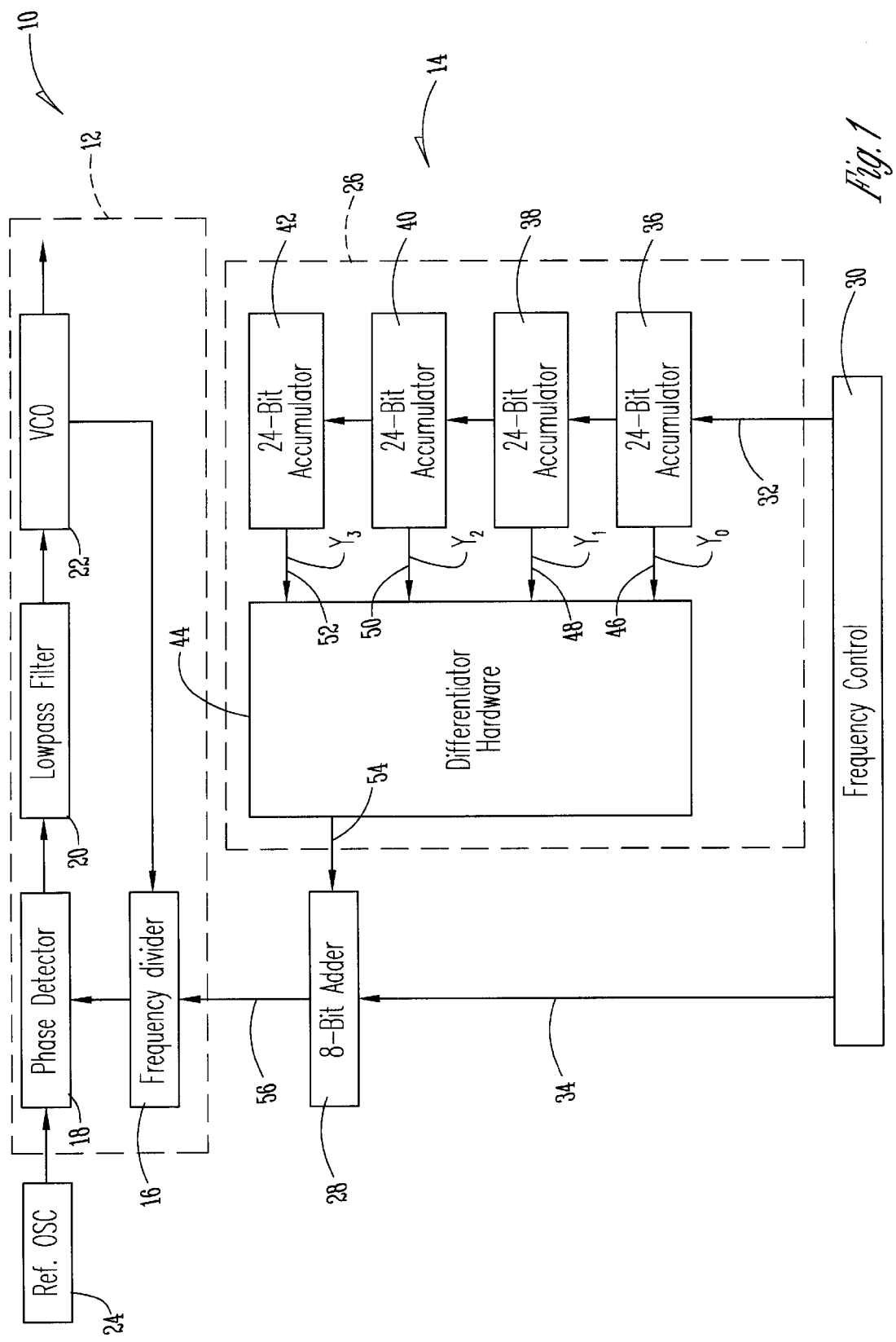
FIG. 1 is a block diagram of a fractional-N frequency synthesizer which utilizes a four signal differentiator component according to the present invention.

FIG. 1 is a block diagram of a fractional-N frequency synthesizer 10 which utilizes a four signal differentiator component implemented according to the present invention. Frequency synthesizer 10 includes a phase locked loop 12 and a frequency divider control circuit 14. The phase lock loop 12 includes a frequency divider 16, a phase detector 18, a low pass filter 20, and a voltage controlled oscillator (VCO) 22. As is understood in the art, the frequency control circuit 14 produces an integer divisor which the frequency divider 16 utilizes to divide the output of the VCO 22. The output of the frequency divider 16 is input into the phase detector 18. A reference oscillator 24 is also input into the phase detector 18. The phase detector 18 produces an output which is dependent on the phase difference between the output of the frequency divisor 16 and the reference oscillator 24. The output of the phase detector 18 is sent through the low pass filter 20 and into the VCO 22. The output frequency of the VCO 22 is dependent on the output of the phase detector 18. This is all understood in the art.

In the present embodiment, the frequency control circuit 14 includes a multistage noise shaper (MASH) 26 and an 8-bit adder 28. The MASH 26 is also referred to as a data modulator. MASH 26 includes four 24-bit accumulators 36, 38, 40, 42 and a differentiator component 44. The output 54 of the MASH structure 26 is a fourth order sigma-delta modulated output. As is understood in the art, each accumulator 36, 38, 40, 42 can be viewed as a sigma-delta modulator. A first order sigma-delta modulation function is performed by each accumulator 36, 38, 40, 42. Noise cancellation and noise shaping is performed by the differentiator component 44. The 24 fractional control bits 32 are input to the first accumulator 36. The 8 integer control bits 34 are input into the 8-bit adder 28. The final adder 28 adds the integer control bits 34 with the modulated output 54 of the MASH structure 26.

In the present embodiment, the four signal differentiator component 44 includes zero through third order differentiator functions. In this specification, an n signal differentiator component is one having an output governed by the equation $$\text{differentiator component output} = \sum_{i=0}^{n-1} Y_i(1-z^{-1})^i$$

wherein n equals 1, 2, 3, . . . , n−1 is the desired order of the differentiator component, $Y_i$ are the inputs to the respective differentiator function of the differentiator component, and z is the z-transform variable. An n signal differentiator component includes n−1, n−2 , . . . , 0 ordered differentiation functions. For a four signal differentiator component, n=4, and the order of the differentiator component is n−1=3. The output of the MASH is $$\text{MASH output} = \sum_{i=0}^{n-1} Y_i(1-z^{-1})^i = X + E_{qn}(1-z^{-1})^n$$

which is shown in equation 56A. $E_{qn}$ is the quantization noise attributable to the n'th accumulator, in this case accumulator 42, and X is the input 32 to the first accumulator 36. $Y_i$ corresponds to the respective carry bits of the accumulators. For the four signal differentiator component 44, n=4. The order of the MASH structure 26 is n=4. It should be noted that a total of n=4 accumulators are used for the fourth order MASH 26.

Figure 2:
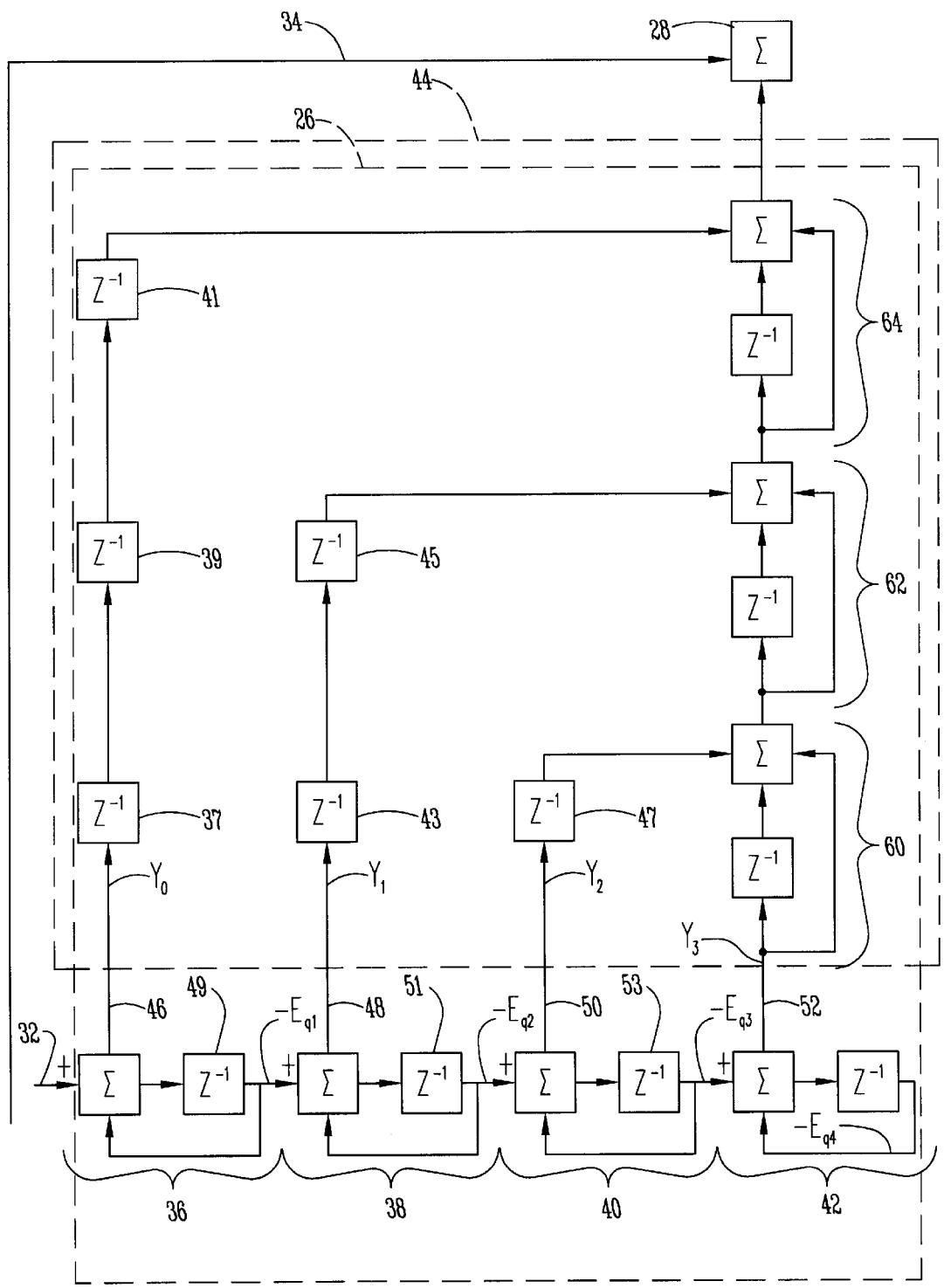
FIG. 2 is a block diagram of a fourth order MASH structure which shows delays that are inserted to compensate for accumulator delays.

FIG. 2 is a block diagram which shows the noise canceling feature of the MASH structure 26. The negative of the quantization error from the first accumulator 36 is the input into the second accumulator 38. The negative of the quantization error of the second accumulator 38 is input into the third accumulator 40. As is understood in the art, the quantization noise from the first through n−1 accumulators is cancelled by the MASH (see FIG. 3), leaving only the quantization noise from the n'th accumulator. The quantization noise of the n'th accumulator 42 is shaped by the differentiator component 44. The quantization noise from the n'th accumulator 42 is subsequently filtered out by the lowpass filter 20.

It should be noted that the "vertical" delays are used for signal synchronization. The three delays, or $z^{-1}$ blocks, 37, 39, 41 that $Y_0$ passes through are inserted due to the "horizontal" accumulator latches 49, 51, 53. Since the signal propagates through three delays 49, 51, 53 before it reaches the integer adder 28, there should be three delays in the $Y_0$ pathway to ensure that the appropriate signal arrives at the proper time. There are two delays 43, 45 in the $Y_1$ pathway to compensate for accumulator delays 51, 53. The delay 47 in the $Y_2$ pathway compensates for accumulator delay 53. Blocks 60, 62, and 64 are comprised of a delay and an adder. Each of the blocks 60, 62, and 64 perform a differentiation, i.e., $(1-z^{-1})$. As the delays 37, 39, 41, 43, 45, and 47 are used for synchronization, they are not shown in subsequent drawings.

FIG. 3 shows the equations that are utilized in constructing a four signal differentiator component according to the present invention. $Y_0$–$Y_3$ correspond with the carry bits (CB) of the accumulators 36, 38, 40, 42. Equations 54A–54D show the inputs $Y_0, Y_1, Y_2, Y_3$ into the four signal differentiator component 44 multiplied by the respective zero through third order differentiator transfer functions that are encompassed by the four signal differentiator component 44. Equation 56A is a summation of equations 54A–54D. Equation 56A is the output of the MASH 26. The output 54 of the MASH is summed with the integer control bits 34 in the 8-bit adder 28.

Figure 9:
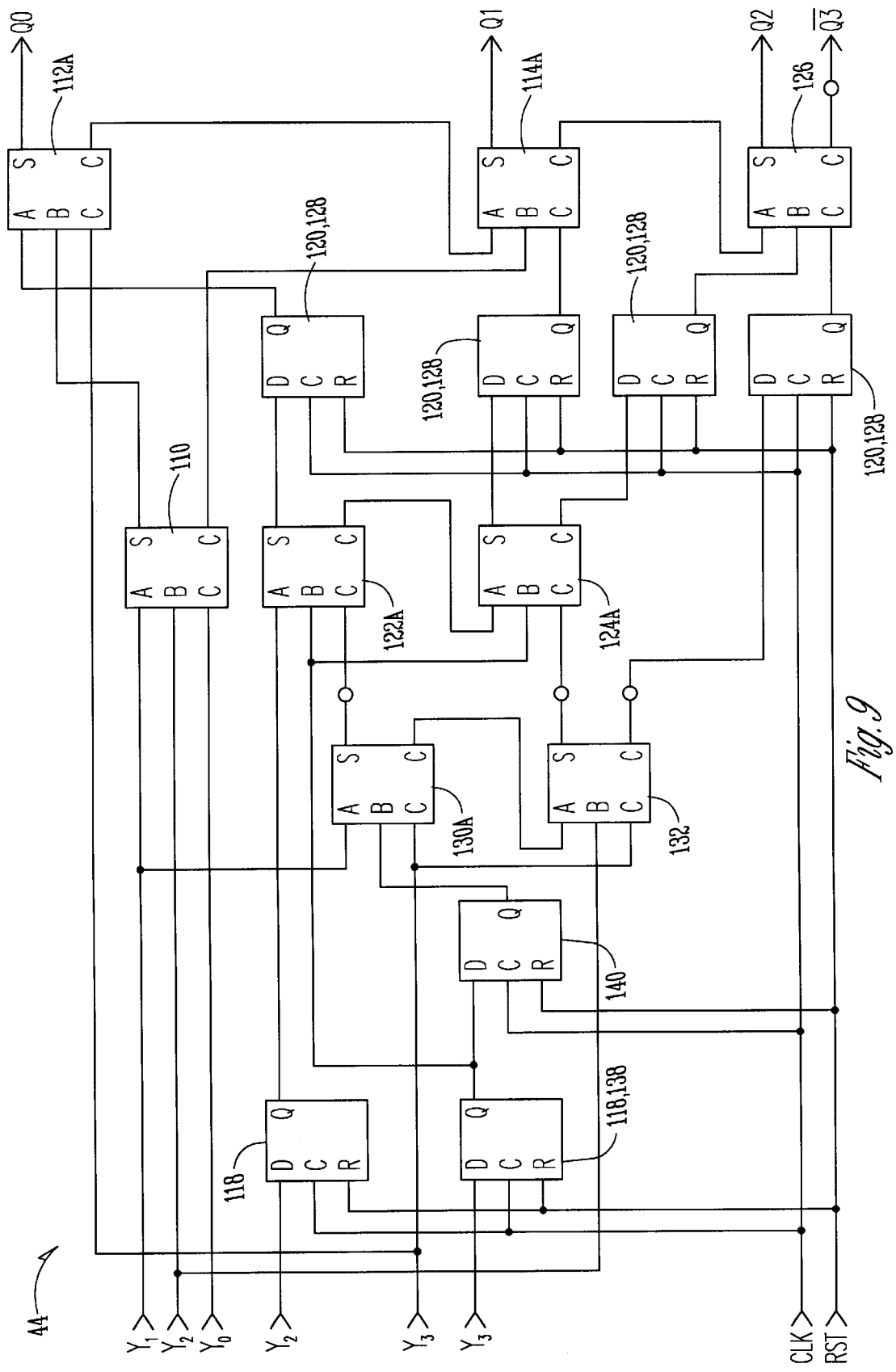
FIG. 9 is a schematic diagram of a like-term summed implementation according to the present invention.
Figure 10:
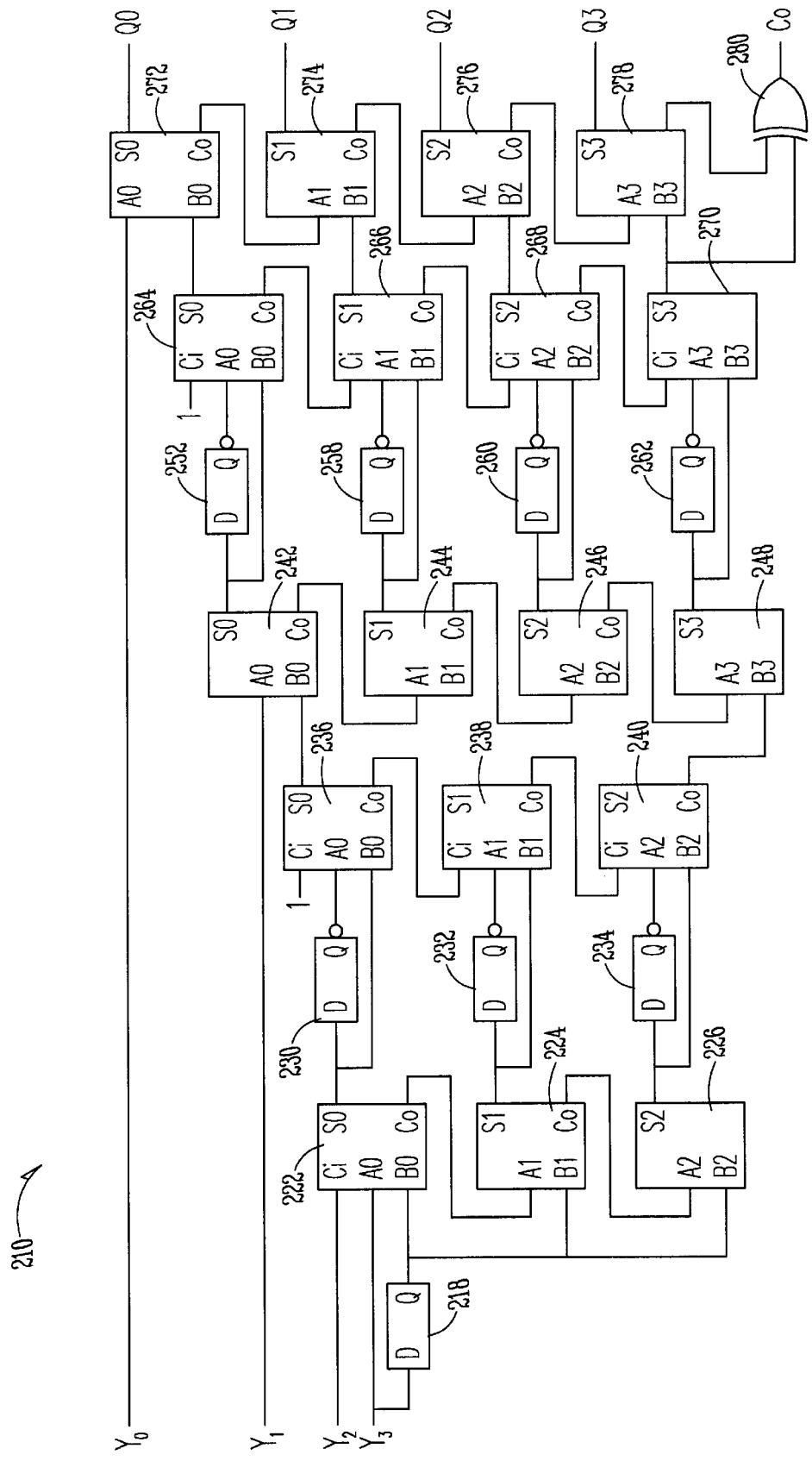
FIG. 10 is a schematic diagram of an implementation of a four signal differentiator component according to the prior art.

For a four signal differentiator component, prior art MASH structures implement equation 56A, as shown in FIG. 10. However, by expanding the left hand side of equation 56A and implementing the expanded form, the number of gates required to implement an equivalent four signal differentiator can be reduced, as shown in FIG. 9.

Equation 58A is a polynomial expansion of equation 56A. Equation 58B shows the coefficients distributed through the parenthetical terms. Equation 58C arranges equation 58B by grouping like terms together. Like terms are those that have the z term raised to the same power. Equation 58D is a grouped form of equation 56C, where all like terms are grouped. Equation 58E has arranged the order of the terms so that positive and negative terms are adjacent. Equation 58F has bracketed the positive and negative terms. Equation 58F is implemented in hardware to reduce the number of gates needed to perform the differentiator function. Equation 58F is referred to as a like-term summed characterization of the output. As can be seen from a brief inspection, equation 58F is mathematically identical to equation 56A.

Figure 4A:
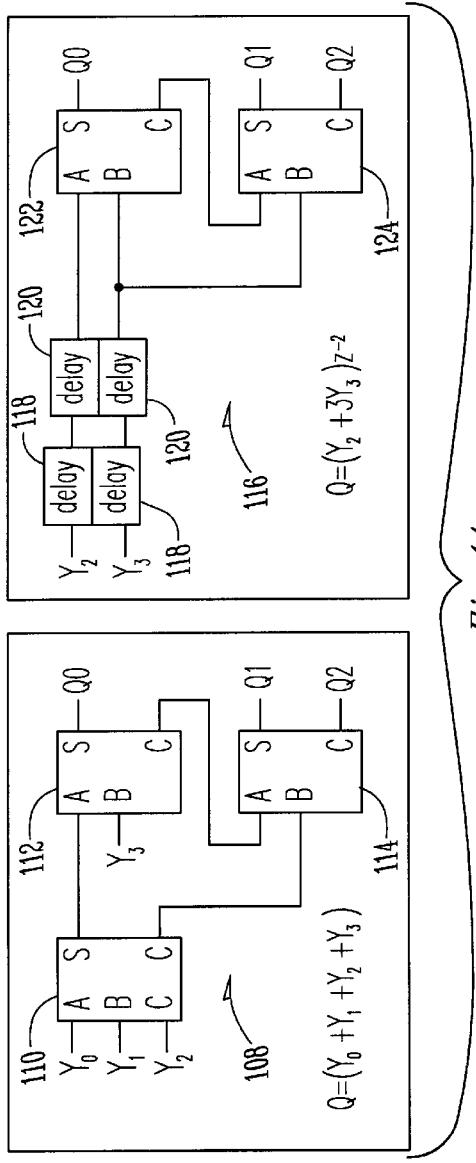
FIG. 4A is a block diagram of circuit elements that are utilized to implement the "positive terms" from FIG. 3.

FIG. 4A is a block diagram of circuits that are used to implement the positive terms from equation 58F. Circuit 108 implements $(Y_0+Y_1+Y_2+Y_3)$, the first expression in the grouped positive terms in equation 58F. $Y_0$, $Y_1$, and $Y_2$ are input into full adder 110. The output of adder 110 is input into half adder 112. $Y_3$ is also input into half adder 112. The carry output of adder 110 is input into half adder 114. The carry output of adder 112 is input into adder 114. The combined output (Q0–Q2) of adders 112 and 114 is $Y_0+Y_1+Y_2+Y_3$.

Circuit 116 of FIG. 4A implements $(Y_2+3Y_3)z^{-2}$, the second expression in the group of positive terms of equation 58F. Inputs $Y_2$ and $Y_3$ are passed through two delays 118, 120, corresponding to $z^{-2}$. The coefficient of three on the $Y_3$ term is realized by inputting the delayed $Y_3$ term into both adders 122 and 124. When $Y_3Z^{-2}$ is 1, and the other inputs are 0, bits Q0 and Q1 are 1 and bit Q2 is 0. Binary 011 is decimal 3. Realizing coefficients by inputting them into the adders in such a manner is referred to as implicit multiplication. Implicit multiplication is performed by inputting a signal into multiple bit positions on a multi-bit adder, or into multiple adders, based on the weight of its respective coefficient. The output of circuit 116, Q0–Q2, is, $(Y_2+3Y_3)z^{-2}$.

Figure 4B:
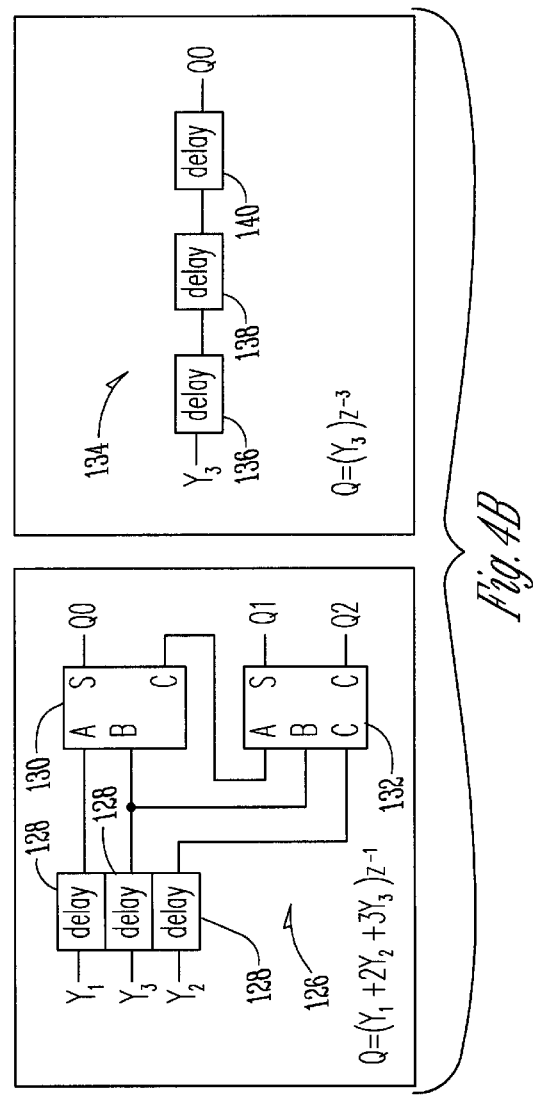
FIG. 4B is a block diagram of circuit elements that are used to implement the "negative terms" from FIG. 3.

FIG. 4B shows circuits that are used to implement the negative terms from equation 58F. Circuit 126 implements $(Y_1+2Y_2+3Y_3)z^{-1}$, the first expression in the group of negative terms. $Y_1$, $Y_2$, and $Y_3$ are input into delays 128 which corresponds to multiplication by $z^{-1}$. To realize a coefficient of 3 on the $Y_3$ term, $Y_3z^{-1}$ is input into adder 130 and 132. When $Y_3z^{-1}$ is equal to 1, bits Q0 and Q1 will be set to 1 and Q2 will be 0, if the other inputs are 0. An output of 011 is equal to decimal 3. The coefficient of 2 on the $Y_2$ term is realized by inputting $Y_2$ (after a delay) into the carry input bit of adder 132. When $Y_2z^{-1}$ is 1, and the other inputs into the adder are 0, bit Q1 will be 1. An output of 010 is decimal 2.

Circuit 134 is used to realize the term $Y_3z^{-1}$, the second expression in the group of negative terms from equation 58F. $Y_3$ is simply passed through three delays 136, 138, 140, corresponding to multiplication by $z^{-3}$. Output Q0 is $Y_3z^{-3}$.

Figure 5:
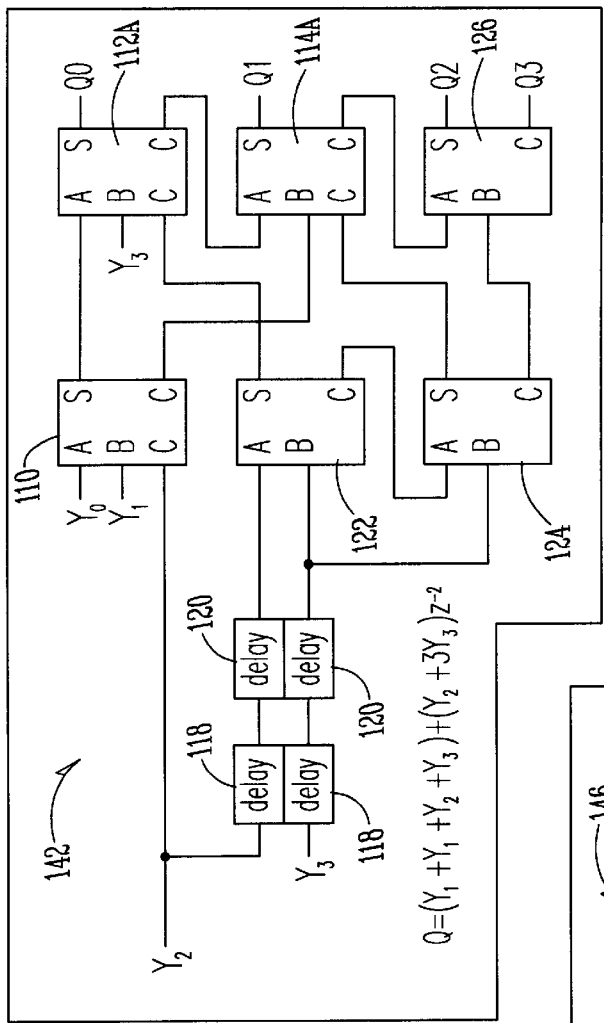
FIG. 5 is a schematic diagram of circuit elements that are used to combine the "positive terms" from FIG. 3.

Referring now to FIG. 5, circuit 142 is a combination of circuits of 108 and 116 (FIG. 4A). Two half adders 112, 114 have been replaced by full adders 112A, 114A. Another half adder 126 has been added to circuit 142 to allow for complete addition of all the terms.

The output of circuit 142 is $[(Y_0+Y_1+Y_2+Y_3)+(Y_2+3Y_3)z^{-2}]$. To show that this is the output, a numeric example is used. Assume a state where all $Y_2$ and $Y_3$ terms are one, and the $Y_0$ and $Y_1$ terms are 0. The expected output of circuit 142 would be decimal 6 $[(0+0+1+1)+(1+3)]$. Decimal 6 should set bits Q2 and Q1 to 1, and bits Q3 and Q0 to 0, wherein 0110 is the binary representation of decimal 6.

For the assumed state, the carry input bit on adder 110 is 1, and input bits A and B are 0. The sum output of adder 110 is 1 and the carry output bit is 0. Inputs A and B of adder 122 are 1. The sum output of adder 122 is 0, and the carry output bit is 1. Inputs A and B of adder 124 are 1. The sum output of adder 124 is 0 and the carry output is 1.

Input A of adder 112A is 1 (sum output of adder 110) and input B is 1. The carry input bit is 0. Therefore, the sum output of adder 112A, bit Q0, is 0. The carry output bit of adder 112A is a 1. Input A of adder 114A is a 1 and input B is a 0. The carry input bit is 0. This input combination results in the sum output, bit Q1, being set to 1. The carry output bit is 0.

Input A on adder 126 is 0 and input B is 1. The sum output, bit Q2, is 1, and the carry output, bit Q3, is 0. Thus, the output of circuit 142 is 0110, which is the expected result of decimal 6. While one numeric example does not prove all cases, it can be shown that for any input, the proper output will be generated.

Figure 6:
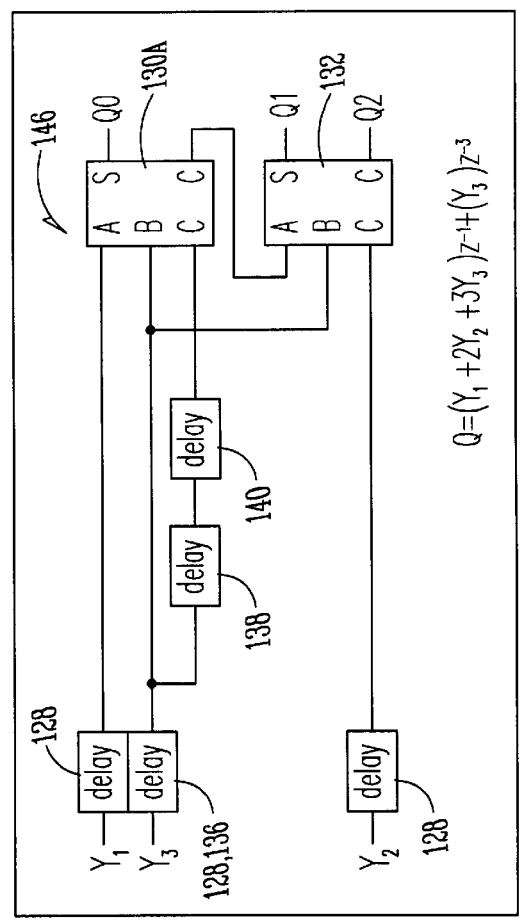
FIG. 6 is a schematic diagram of circuit elements that are used to combine the "negative terms" from FIG. 3.

Circuit 146 of FIG. 6 is a combination of circuits 126 and 134 (FIG. 4B). Half adder 130 has been replaced by a full adder 130A. Utilizing the same assumed state from the previous example, the expected output of circuit 146 is decimal 6, i.e., 0+2+3+1. Inputs A and B on adder 130A are 0 and 1, respectively. The carry input bit is 1. Therefore, the sum output (Q0) is 0, and the carry output is 1.

Inputs A and B and the carry input are all 1 on adder 132. The sum output, Q1, and the carry output, Q2, are both 1. The output of circuit 146 (Q2–Q0) is 110, which is decimal 6.

Figure 7A:
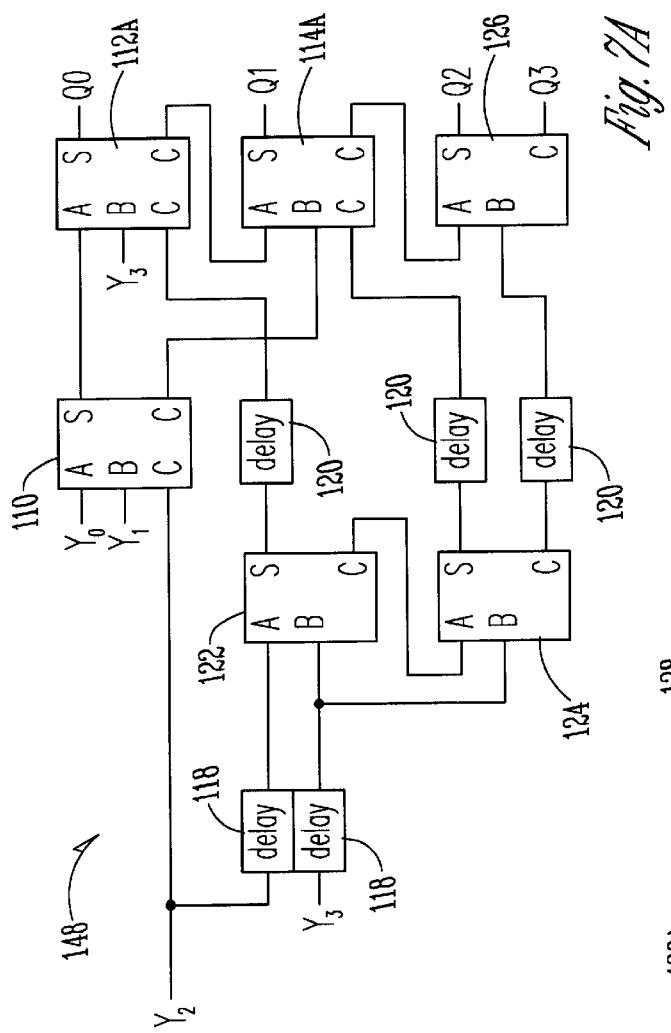
FIG. 7A is a schematic diagram in which the hardware from FIG. 5 has been reorganized.

Circuit 148 of FIG. 7A varies slightly from circuit 142 of FIG. 5. The only difference is that the delays 120 now come after adders 122, 124 rather than before them. It is understood, from superposition, that it does not change anything in moving the delays to the outputs of the adders. However, moving the delays helps reduce gates when circuits 148 and 150 (FIG. 7B) are combined.

Figure 7B:
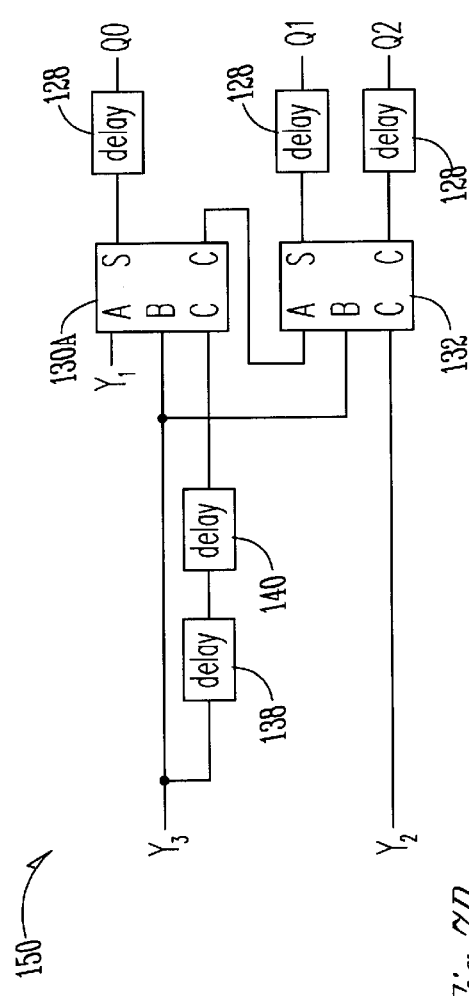
FIG. 7B is a schematic diagram in which the hardware of FIG. 6 has been reorganized.

Referring to FIG. 7B, circuit 150 is similar to circuit 146. Once again, delays 128 have been moved from the inputs to the outputs of the adders 130A, 132. Moving the delays does not affect the output.

Figure 8:
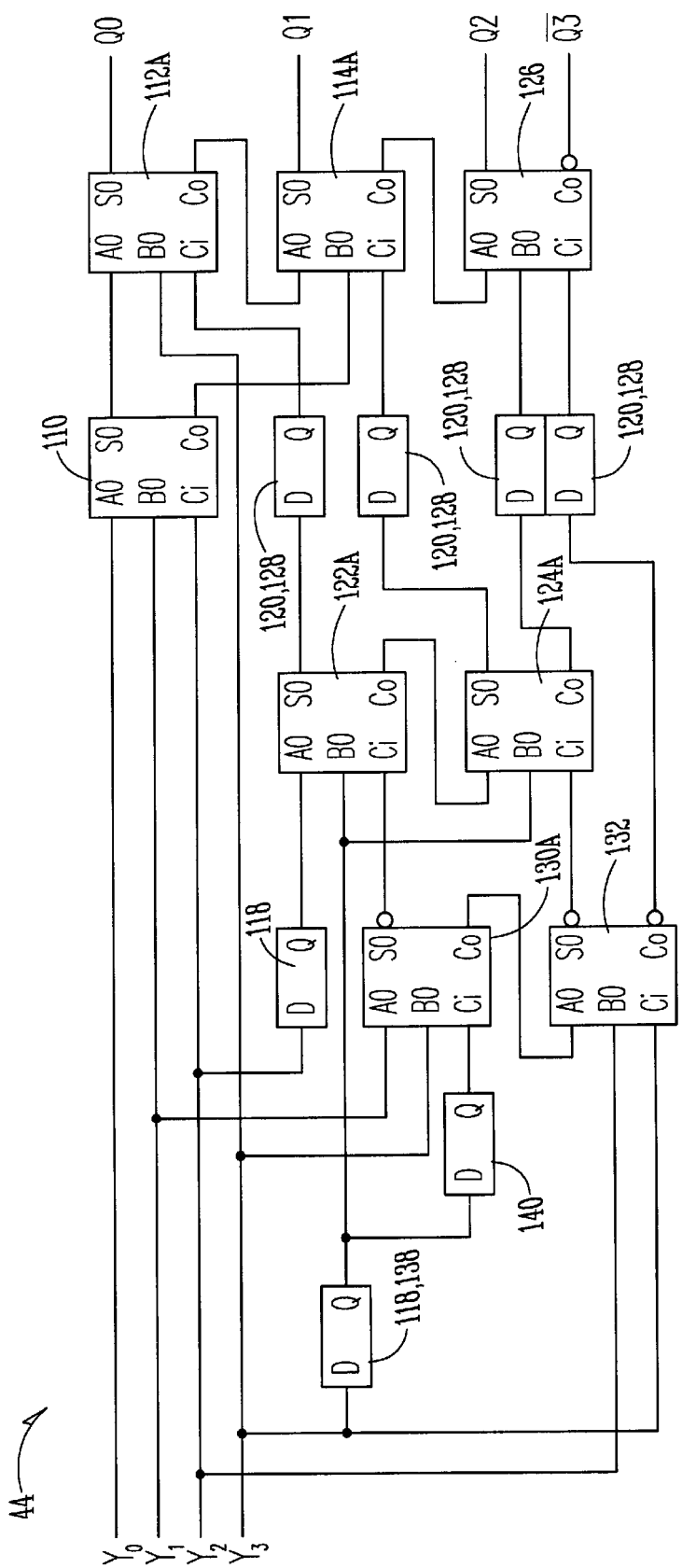
FIG. 8 is a schematic diagram of a like-term summed implementation of a four signal differentiator component.

FIG. 8 is a block diagram of a four signal differentiator component 44 according to the present invention. The differentiator component 44 is a combination of circuits 148 and 150 (FIGS. 7A and 7B). To realize the negative terms of equation 58F (FIG. 3), two's complement addition is utilized, wherein A−B=A+$\overline{B}$+1. The two's complement addition is not completed within the differentiator component 44. Rather, the two's complement addition is completed in the eight bit adder 28 (FIG. 1) by inputting a 1 into the carry input bit of the adder 28. For this reason, the output of the differentiator component 44 in FIG. 8 has the −1 term at the end of the equation.

The same numerals that were used in FIGS. 7A and 7B are used in FIG. 8 to show continuity between the circuits. The inversion ($\overline{B}$) necessary to perform two's complement addition is achieved by inverting the sum (SO) output of adder 130A and the sum (SO) and carry outputs (Co) of adder 132.

From the coefficients in equation 58F, it can be seen that the maximum value of all positive valued contributions is eight, and that the maximum value of all negative valued contributions is negative seven. Since the negative term only requires a three bit binary representation, and since the binary representation is subtracted from the positive term, which requires a four bit binary representation, the binary representation of the negative term is extended to four bits by appending a zero in the most significant bit position. Then, since binary subtraction involves inverting the subtrahend, the extended bit becomes a one. Given that the negative term can always be represented with three bits, the inverted extended bit will always have a value of one. This is equivalent to adding a one in the position of a fourth bit—a process that will always invert the most significant bit of the sum of the binary representation of the positive term in the inverted binary representation of the negative term. Therefore, bit Q3 needs to be inverted. Since the output signal takes on both positive and negative values, the sign bit (Q3) is extended to the top of the integer adder 28.

FIG. 9 is a gate level schematic of a four signal differentiator component 44. The gates in FIG. 9 are implemented using emitter coupled logic (ECL). Some of the inputs have been rearranged so that the associated inputs and outputs are on the same ECL level. The numbers signifying the various ECL levels are not shown in FIG. 9. It should be apparent that FIG. 9 is identical to FIG. 8.

FIG. 10 is a schematic diagram of a prior art four signal differentiator component 210. An analysis of the differentiator component 210 shows that the output is that of equation 56A, which is identical to the output of the differentiator component 44 of the present invention. FIG. 10 exemplifies how many gates the prior art required to implement a third order differentiator component. Differentiator component 210 includes a latch 218 and seven inverting latches 230, 232, 234, 252, 258, 260, 262. In addition, differentiator component 210 uses eight full adders 222, 236, 238, 240, 264, 266, 268, 270. Finally, the differentiator component 210 utilizes ten half adders 224, 226, 242, 244, 246, 248, 272, 274, 276, 278, and one XOR gate 280. The XOR gate 280 is used for the sign bit.

A simple comparison of the four signal differentiator component 44 of FIG. 8 and the four signal differentiator component 210 of FIG. 10 shows the reduction in gates achieved by the present invention. The differentiator component 44 of the present invention uses one less latch, ten less half adders, the same number of full adders, and one less XOR gate. Of course, the latch, XOR gate, and ten half adders utilize many transistors to implement their logic functions. Thus, it can be seen that the differentiator component 44 of the present invention requires fewer gates to perform the same mathematical function. Fewer gates means that the differentiator component 44 will consume less power than the prior art differentiator component 210.

Thus, an improved differentiator component is disclosed having a simplified construction which provides the desired reduction in internal components, and thereby a corresponding reduction in energy consumption, heat generation, and risk of failure. From the foregoing, it will be observed that numerous variations and modifications may be affected without departing from the spirit and scope of the novel concepts of the present invention. It will be understood that no limitation with respect to the specific embodiment illustrated herein is intended or should be inferred. The terms and expressions which have been employed herein are used as terms of description and not of limitation. There is no intent in the use of such terms and expressions to exclude any future equivalents of features shown and described herein, but it is recognized that various modifications are possible within the scope of invention now claimed.

What is claimed is:

1. An n signal differentiator component, wherein n is greater than or equal to two, comprising:
    at least one adder having inputs and outputs;
    a plurality of latches having inputs and outputs;
    connection of the inputs and outputs of the latches and adders dependent on a polynomial expansion of a z-transforn characterization of an output of the differentiator, wherein the polynomial expansion is a like-term summed equation.

2. The differentiator component of claim 1, wherein the inputs and outputs of the latches and the at least one adder are connected so that coefficients are realized through implicit multiplication.

3. The differentiator component of claim 2, wherein the inputs and outputs of the latches and the at least one adder are connected so that negative coefficients are realized by two's complement representation.

4. The differentiator component of claim 1, wherein bipolar logic gates are used to implement the adder and latches.

5. The differentiator component of claim 4, wherein the bipolar logic gates are emitter coupled logic gates.

6. The differentiator component of claim 1, wherein n is greater than or equal to four.

7. The differentiator of claim 1, wherein the at least one adder is a plurality of half and full adders.

8. The differentiator component of claim 1, further comprising:
    n accumulators, wherein carry bits of the accumulators are inputs to the differentiator component.

9. The apparatus of claim 8, further comprising:
    a final adder, wherein an output of the differentiator component is connected to the final adder and integer control bits are also connected to the final adder.

10. The apparatus of claim 9, further comprising:
    a phase locked loop, wherein an output of the final adder is an input to a frequency divider of the phase locked loop.

11. A method of reducing gates in an n signal differentiator component, comprising:
    utilizing a z-transform to characterize an output of the differentiator component;
    providing latches and adders having inputs and outputs;
    connecting inputs and outputs of the latches and adders, the number of latches and adders and their connections dependent on a polynomial expansion of the z-transform characterization, wherein the polynomial expansion is a like-term summed equation.

12. The method of claim 11, wherein n is four or greater.

13. The method of claim 11, wherein coefficients are realized through implicit multiplication.

14. The method of claim 11, wherein negative numbers are realized by utilizing two's complement representation.

* * * * *